(12) United States Patent
Lebo

(10) Patent No.: US 6,741,466 B1
(45) Date of Patent: May 25, 2004

(54) MODULAR ELECTRONICS SYSTEM CHASSIS

(75) Inventor: Steve I. Lebo, Cedar Rapids, IA (US)

(73) Assignee: Rockwell Collins, Cedar Rapids, IA (US)

( * ) Notice: Subject to any disclaimer, the term of this patent is extended or adjusted under 35 U.S.C. 154(b) by 16 days.

(21) Appl. No.: 10/198,493

(22) Filed: Jul. 18, 2002

(51) Int. Cl.$^7$ ................................................ G06F 1/16

(52) U.S. Cl. ...................... 361/687; 361/697; 361/700; 439/152; 29/830

(58) Field of Search ................................. 361/683, 687, 361/686, 729, 727, 728, 732, 740, 742, 752, 759, 796, 801, 803, 807–810; 211/41.17; 174/15.1, 16.1, 35 R; 62/414, 418; 165/80.2, 80.3, 185; 254/104; 403/374, 409.1; 439/61, 64, 76, 485; 454/184; 455/345–349; 248/562; 220/9.1, 669

(56) References Cited

U.S. PATENT DOCUMENTS

| | | | |
|---|---|---|---|
| 4,899,210 A | | 2/1990 | Lorenzetti et al. .......... 257/712 |
| 4,953,058 A | | 8/1990 | Harris ......................... 361/690 |
| 5,065,141 A | * | 11/1991 | Whitsitt ...................... 340/635 |
| 5,099,550 A | | 3/1992 | Beane et al. .................. 24/555 |
| 5,138,523 A | | 8/1992 | Benck et al. ................ 361/687 |
| 5,327,324 A | | 7/1994 | Roth ........................... 361/707 |
| 5,343,361 A | | 8/1994 | Rudy et al. .................. 361/710 |
| 5,381,314 A | | 1/1995 | Rudy, Jr. et al. ............ 361/712 |
| 5,388,995 A | | 2/1995 | Rudy, Jr. et al. ............. 439/61 |
| 5,428,535 A | | 6/1995 | Katsumata et al. ..... 364/424.05 |
| 5,436,794 A | * | 7/1995 | Clemente et al. ........... 361/704 |
| 5,546,273 A | * | 8/1996 | Harris ......................... 361/697 |
| 5,791,042 A | * | 8/1998 | Baum et al. .................. 29/830 |
| 5,796,583 A | | 8/1998 | Gale et al. ................... 361/704 |
| 5,808,866 A | * | 9/1998 | Porter ......................... 361/695 |
| 5,844,777 A | * | 12/1998 | Gates .......................... 361/700 |
| 5,940,288 A | | 8/1999 | Kociecki ...................... 363/144 |
| 6,046,913 A | | 4/2000 | Helmstetter et al. ........ 361/796 |
| 6,166,919 A | | 12/2000 | Nicolici et al. ............. 361/800 |
| 6,172,873 B1 | | 1/2001 | Davis et al. ................. 361/716 |
| 6,239,972 B1 | | 5/2001 | Tehan et al. ................. 361/704 |
| 6,375,475 B1 | | 4/2002 | Brodsky ....................... 439/66 |
| 6,409,213 B2 | | 6/2002 | Webber et al. .............. 280/739 |
| 6,456,505 B1 | | 9/2002 | Suzuki et al. ................ 361/803 |
| 6,508,595 B1 | | 1/2003 | Chan et al. .................... 385/92 |
| 6,544,052 B1 | * | 4/2003 | Schwartz ..................... 439/152 |
| 6,565,119 B2 | | 5/2003 | Fogle .......................... 280/735 |

OTHER PUBLICATIONS

U.S. application No. 10/229,877, titled Software Radio System and Method, filed on Aug. 28, 2002.

U.S. application No. 10/229,941, titled Modular Communication Platform, filed Aug. 28, 2002.

Co–pending patent application entitled "Modular Electronics System Package" filed on an even date, inventor S. Lebo.

Co–pending patent application entitled "Ruggedized Electronics Sub–System Module" filed on an even date, inventor S. Lebo.

(List continued on next page.)

Primary Examiner—Michael Datskovskiy
(74) Attorney, Agent, or Firm—Nathan O. Jensen; Kyle Eppele

(57) ABSTRACT

A chassis for a ruggedized modular electronics system is disclosed. The chassis includes an open support structure that is configured to support ruggedized electronics modules. The open support structure allows ambient airflow around the exterior of the ruggedized electronics modules. A first electrical connector is supported by the support structure and a second electrical connector is supported by the support structure. The second electrical connector is electrically coupled to the first electrical connector.

14 Claims, 9 Drawing Sheets-

OTHER PUBLICATIONS

Co-pending patent application entitled "Ruggedized Electronic Module Cooling System" filed on an even date, inventor S. Lebo and S. Sellner.

Co-pending patent application entitled "Electronic Module Restraint Apparatus" filed on an even dat , inventor S. Lebo and S. Sellner.

Co-pending patent application entitled "Restraint Apparatus For An Electronics Module" filed on an even date, inventor S. Lebo.

"SINCGARS, Evolution to Revolution", ITT Industries (www.acd.itt.com).

* cited by examiner

MODULAR ELECTRONICS SYSTEM CHASSIS

REFERENCE TO RELATED PATENT APPLICATIONS

This application relates to the following group of applications filed on the same day herewith. Each application in the group relates and incorporates by reference, each other application in the group. The invention of each application is assigned to the assignee of this invention. The group of applications includes the following:

U.S. patent application Ser. No. 10/198,520, entitled "MODULAR ELECTRONICS SYSTEM PACKAGE", and having inventor Steve I. Lebo;

U.S. patent application Ser. No. 10/198,361, entitled "RUGGEDIZED ELECTRONICS SUB-SYSTEM MODULE", and having inventor Steve I. Lebo;

U.S. patent application Ser. No. 10/197,737, entitled "RUGGEDIZED ELECTRONIC MODULE COOLING SYSTEM", and having inventors Steve I. Lebo and Scott J. Sellner;

U.S. patent application Ser. No. 10/198,473, entitled "ELECTRONIC MODULE RESTRAINT APPARATUS", and having inventors Steve I. Lebo and Scott J. Sellner; and U.S. patent application Ser. No. 10/198,522, issued as U.S. Pat. No. 6,574,117 on Jun. 3, 2003, entitled "RESTRAINT APPARATUS FOR AN ELECTRONICS MODULE", and having inventor Steve I. Lebo.

BACKGROUND

The subject matter disclosed relates to ruggedized modular electronics systems. Further, the subject matter disclosed relates to a chassis for a ruggedized modular electronics system. More particularly, the subject matter disclosed relates to a ruggedized modular radio system chassis for use in military vehicles and the like.

Many electronics systems exist for providing radio communications to and from vehicles. Such conventional electronics systems may be ruggedized for use in situations that are exposed to harsh environmental conditions such as dirty conditions, vibrational conditions, etc.

Although ruggedized electronics systems have been developed, these systems do not conventionally include options for reconfiguration of the systems via an exchange of modular components. Conventionally, ruggedized systems use a line replaceable unit (LRU), which is a sealed box containing a plurality of shop replaceable units (SRUs), which are typically electronics cards that may be inserted into the LRU when the sealed LRU is opened.

Conventionally, SINCGARS VHF frequency hopping radios have been used in military and rugged applications. SINCGARS radios are conventionally a single package system in which electronic components are fit into a ruggedized chassis. SINCGARS, however, have the disadvantage of not being easily reconfigurable with a plurality of ruggedized modular components, each having their own ruggedized package.

Accordingly, there is a need for a mechanical packaging system solution for electronics that use a minimum number of electronic sub-systems including a ruggedized chassis. There is also a need for a ruggedized chassis for modular electronics that performs in rugged environments including but not limited to military environments and may be fully immersed. Further still, there is a need for a ruggedized chassis for modular electronics that performs in both ground and airborne applications. Yet further still, there is a need for a ruggedized chassis which may be reconfigured with various electronic modules to provide a plurality of platform and waveform configurations. Still further, there is a need for a ruggedized chassis for modular electronics that enables flexibility and scalability and allows for multiple end configurations to be assembled with a minimum subset of electronic sub-system types. And further still, there is a need for a ruggedized chassis for modular electronics that allows for heat removal associated with the electronic sub-systems.

It would be desirable to provide a system and/or method that provides one or more of these or other advantageous features. Other features and advantages will be made apparent from the present specification. The teachings disclosed extend to those embodiments which fall within the scope of the appended claims, regardless of whether they accomplish one or more of the aforementioned needs.

SUMMARY

One example of the invention relates to a chassis for a ruggedized modular electronics system. The chassis includes an open support structure configured to support ruggedized electronics modules. The open support structure allows ambient airflow around the exterior of the ruggedized electronics modules. A first electrical connector is supported by the support structure and a second electrical connector is supported by the support structure. The second electrical connector is electrically coupled to the first electrical connector.

Another example of the invention relates to a chassis for a ruggedized module electronics system. The chassis includes a means for supporting a first ruggedized electronics module and a second ruggedized electronics module. The means for supporting allows ambient airflow around the exterior of the first and second ruggedized electronics modules. The chassis also includes a first means for connecting a first ruggedized electronics module to a second ruggedized electronics module. The first means is supported by the means for supporting. The chassis also includes a second means for connecting a second ruggedized electronics module to the first ruggedized electronics module. The second means for connecting is supported by the means for supporting.

Yet another example of the invention relates to a support structure for a ruggedized modular electronics system. The support structure includes a base portion, two opposing side portions extending from the base portion, and a rear portion extending from the base portion. The rear portion supports more than one electrical connector. The support structure also includes a power supply supported by the rear portion and configured to provide power to ruggedized electronics modules coupled to the electrical connectors.

Alternative examples of the invention relate to other features and combination of features as may be generally recited in the claims.

BRIEF DESCRIPTION OF THE DRAWINGS

The invention will become more fully understood from the following detailed description, taken in conjunction with the accompanying drawings, wherein like reference numerals refer to like elements, in which.

DETAILED DESCRIPTION OF EXEMPLARY EMBODIMENTS

Figure 1:
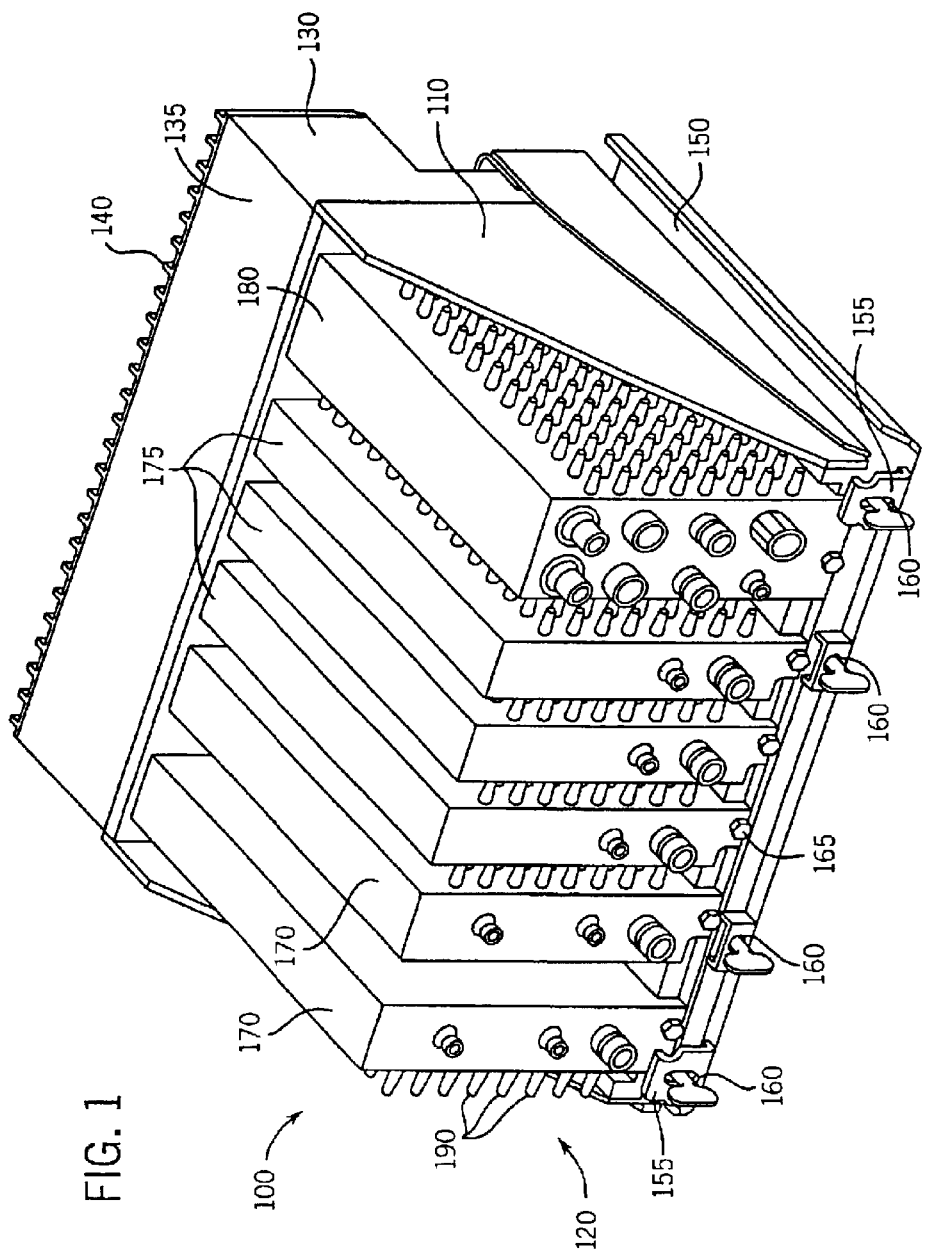
FIG. 1 is an exemplary perspective view of a modular electronic systems package supported on a chassis and having electronic modules installed thereon.

Referring to FIG. 1, an exemplary embodiment of an electronics system, for example, a modular electronic radio system 100, is depicted. Modular radio system 100 includes a chassis 110 (platform adapter or vehicular adapter) which supports a plurality of modular electronic components 120. Chassis 110 includes, in an exemplary embodiment, a power source 130 having a plurality of cooling fins 140 extending from a power source housing 135. Power source 130 provides power to the plurality of electronic modules 120.

In an exemplary embodiment, chassis 110 may be coupled to a mount 150 that provides for attachment to a vehicle, or other surface, and may be configured with damping devices to provide for vibration suppression and damping of vibrations which may be imparted from the mounting surface, such as a vehicle, to electronic modules 120. In the exemplary embodiment depicted, chassis 110 may be coupled to mount 150 via any of a plurality of means including, but not limited to, clamps 155 and further secured by screws and/or other fasteners through apertures 160 for securing mount 150 and chassis 110. In an exemplary embodiment, chassis 110 may be formed of any of a variety of materials, including, but not limited to, aluminum. Chassis 150 may alternatively be formed of other adequately rigid materials, such as, but not limited to, metals, metal alloys, polymers, ceramics, and composite materials.

In the exemplary embodiment depicted in FIG. 1, a plurality of electronic components 120 are coupled to chassis 110. Electronic modules 120 include, but are not limited to, power amplifiers 170, transceivers 175, and a Platform Interface Module (PIM) 180. Each of modular electronic components 120 is provided in a ruggedized housing formed of aluminum, or other adequately rigid materials and is sealed such that the casing or housing is impermeable by water and/or other liquids. Further, the housings of electronic modules 120 are configured such that they are resistant to chemical attack and/or penetration as well as resistant to dirt and vibrations. Further still, each of electronic modules 120 includes a plurality of cooling pins 190 formed on at least one and typically two outer surfaces of electronic modules 120 to provide for disposal of thermal energy created by electronic components inside each electronics module. Such pins 190 may be configured in such a manner that they are not easily broken off from the exterior surface of the electronic modules, i.e. the cooling pins have ruggedized characteristics due to their size and geometry, and further, in a preferred embodiment pins 190 allow for cooling through natural convective currents, i.e. using cooling pins 190, active cooling modules, e.g. a fan module, may not be required to maintain electronic modules 120 at or below a desired operating temperature.

System 100 is a flexible and adaptable electronic packaging system that allows for various combinations of ruggedized electronic modules 120. System 100 includes a ruggedized modular electronic platform adaptor or chassis 110 and a plurality of ruggedized electronic modules 120. In an exemplary embodiment, a single module mounting position and chassis may not have to be dedicated to a single modular function, but rather may be configured such that it may be equipped with different module functions as required. Further, in an exemplary embodiment, system 100 may be configured to meet environmental conditions, for example, those required for military applications, including immersion. In an exemplary embodiment, modules 120 perform radio system functions; however, the concepts disclosed are not limited to radio systems alone, but may be applied to any of a variety of electronics systems. In an exemplary embodiment, electronic modules 120 may be configured to provide 2-channel to 4-channel communications.

With regard to system 100, varying types of electronic modules 120 may be installed in different combinations on chassis 110 to create various end-item configurations. For example, as depicted in FIG. 1, chassis 100 includes two power amplifiers 170, three transceivers 175, and a PIM 180. However, chassis 110 may be configured with more or less modular component sites and, further, may include any of a variety of electronic modules.

Figure 4:
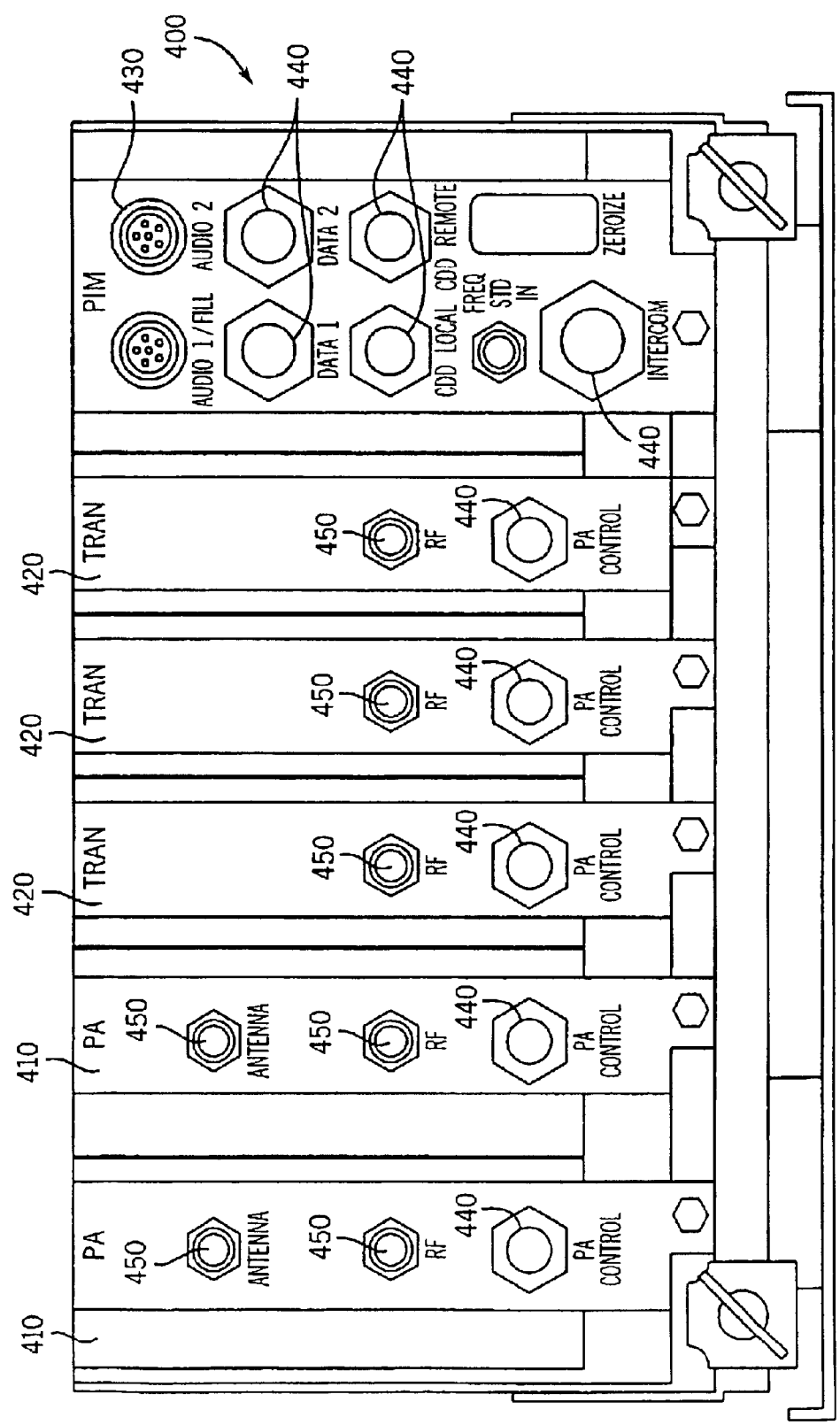
FIG. 4 is an exemplary front elevation view of a modular electronics system including two power amplifiers, three transceivers, and a PIM.

Referring now to FIG. 4, a front elevation view of a system 400 is depicted. System 400 includes two power amplifiers 410, three transceivers 420, and a PIM 430. Electronic modules 410, 420, and 430 are ruggedized modules having ruggedized housings and are sealed to prevent infiltration of water, dirt, and the like. In a particular exemplary embodiment, modules 410, 420, and 430 may be approximately 7.0 to 7.5 inches high and vary in width from 1.35 to 2.6 inches. However, individual modules 410, 420, and 430, are not limited to the dimensions recited; the dimensions recited are merely exemplary of a particular embodiment. Each of modules 410, 420, and 430 may include, for example, on the front face, control knobs, buttons, or any other input devices. Rear face 1220 may, for example, include input devices and/or connectors. Further, modules 410, 420, and 430 may include input connectors, such as pinned connectors 440 and the like, coaxial connectors 450 and the like, and/or other types of electrical connectors.

Figure 5:
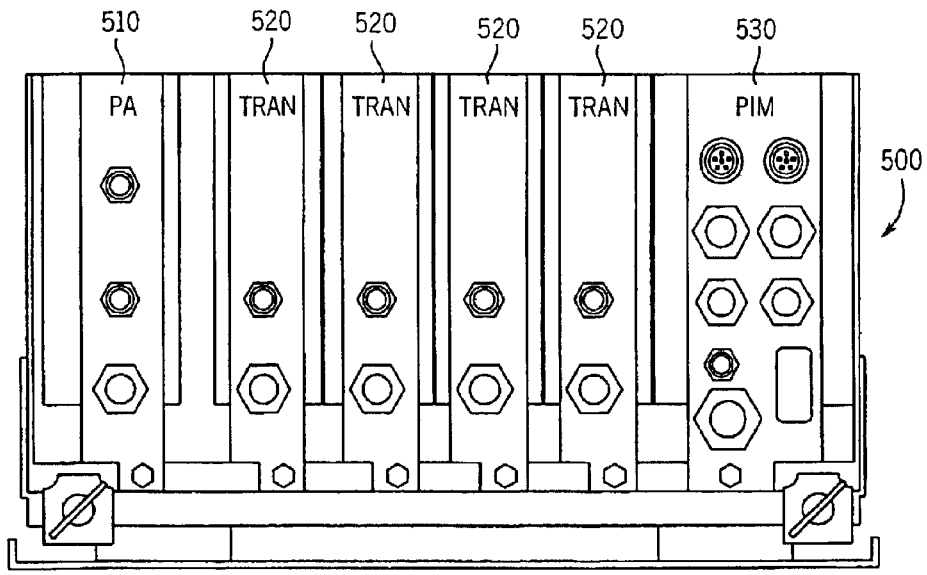
FIG. 5 is an exemplary front elevation view of an alternative configuration of electronic modules including a single power amplifier, four transceivers, and a PIM.

Referring now to FIG. 5, a system 500 is depicted forming an alternative electronics system configuration. System 500 includes a single power amplifier 510, four transceivers 520, and a PIM 530.

Figure 6:
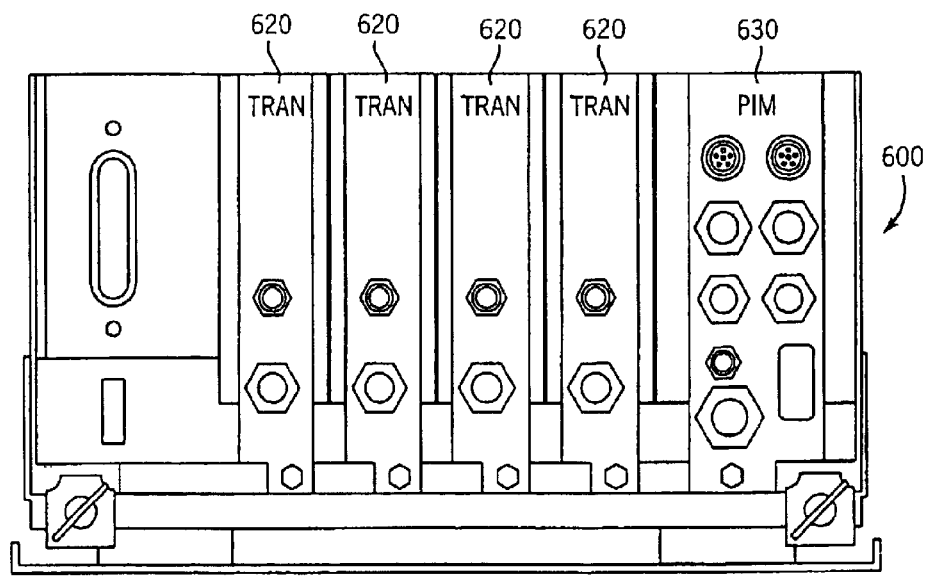
FIG. 6 is another exemplary front elevation view of an alternative configuration of electronic modules including four transceivers and a PIM.

Similarly, referring now to FIG. 6, a system 600 is formed by another alternative configuration of electronic modules, including four transceivers 620 and a PIM 630.

Figure 7:
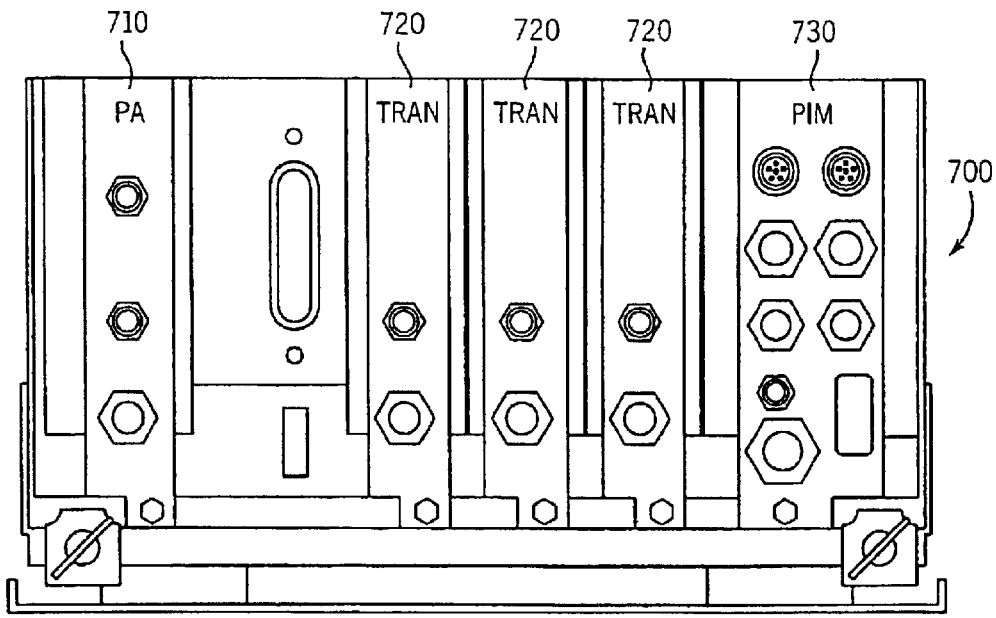
FIG. 7 is yet another exemplary front elevation view of an alternative configuration of electronic modules including a single power amplifier, three transceivers, and a PIM.

Referring now to FIG. 7, a system 700 is depicted. System 700 is an alternative configuration of electronic modules, including a single power amplifier 710, three transceivers 720, and a PIM 730.

Figure 8:
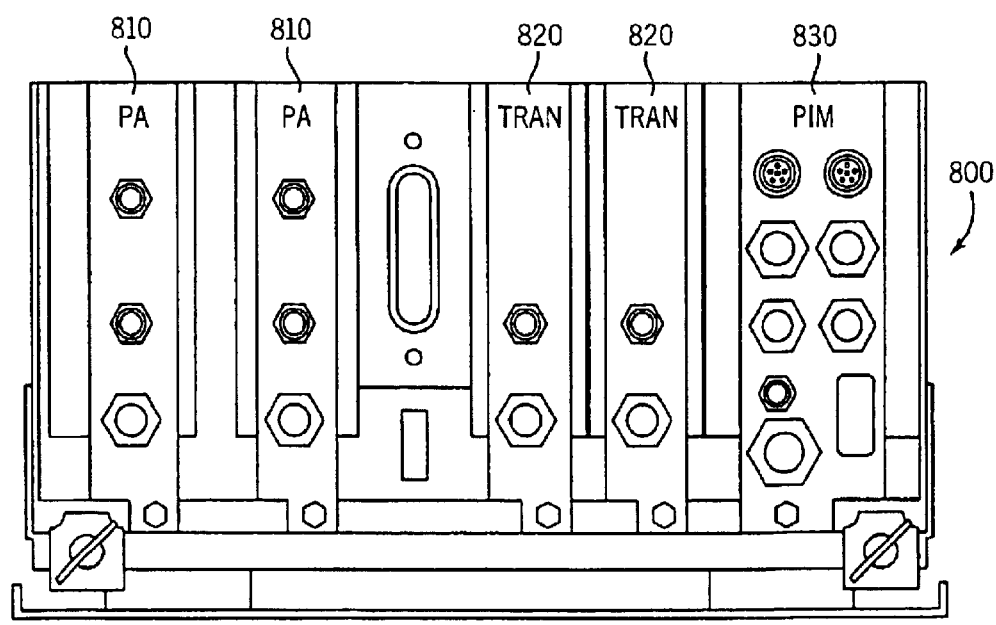
FIG. 8 is still yet another exemplary front elevation view of an alternative configuration of electronic modules including two power amplifiers, two transceivers, and a PIM.

Referring now to FIG. 8, a system 800 is depicted. System 800 is yet another exemplary embodiment of an alternative configuration of electronic modules, including two power amplifiers 810, two transceivers 820, and a PIM 830.

Figure 9:
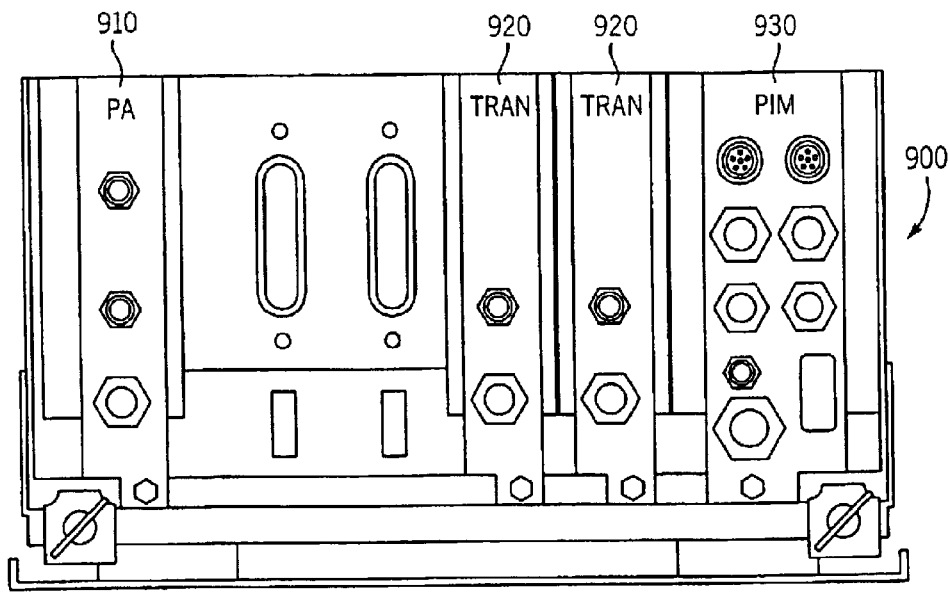
FIG. 9 is yet still another exemplary front elevation view of an alternative configuration of electronic modules including a single power amplifier, two transceivers, and a PIM.

Referring now to FIG. 9, a system 900 is depicted. System 900 includes a power amplifier 910, two transceivers 920, and a PIM 930. Thus, it is abundantly clear that the ruggedized electronics systems depicted may be configured in any of a variety of manners and may further be reconfigured using a different combination of electronic modules. Further, it should be noted that each of the electronic modules is individually ruggedized, having a ruggedized housing and including ruggedized components and further being sealed from infiltration by water and other contaminants. The systems described above form radio systems, however, the modular ruggedized electronics systems may be used form other types of electronics systems.

Figure 2:
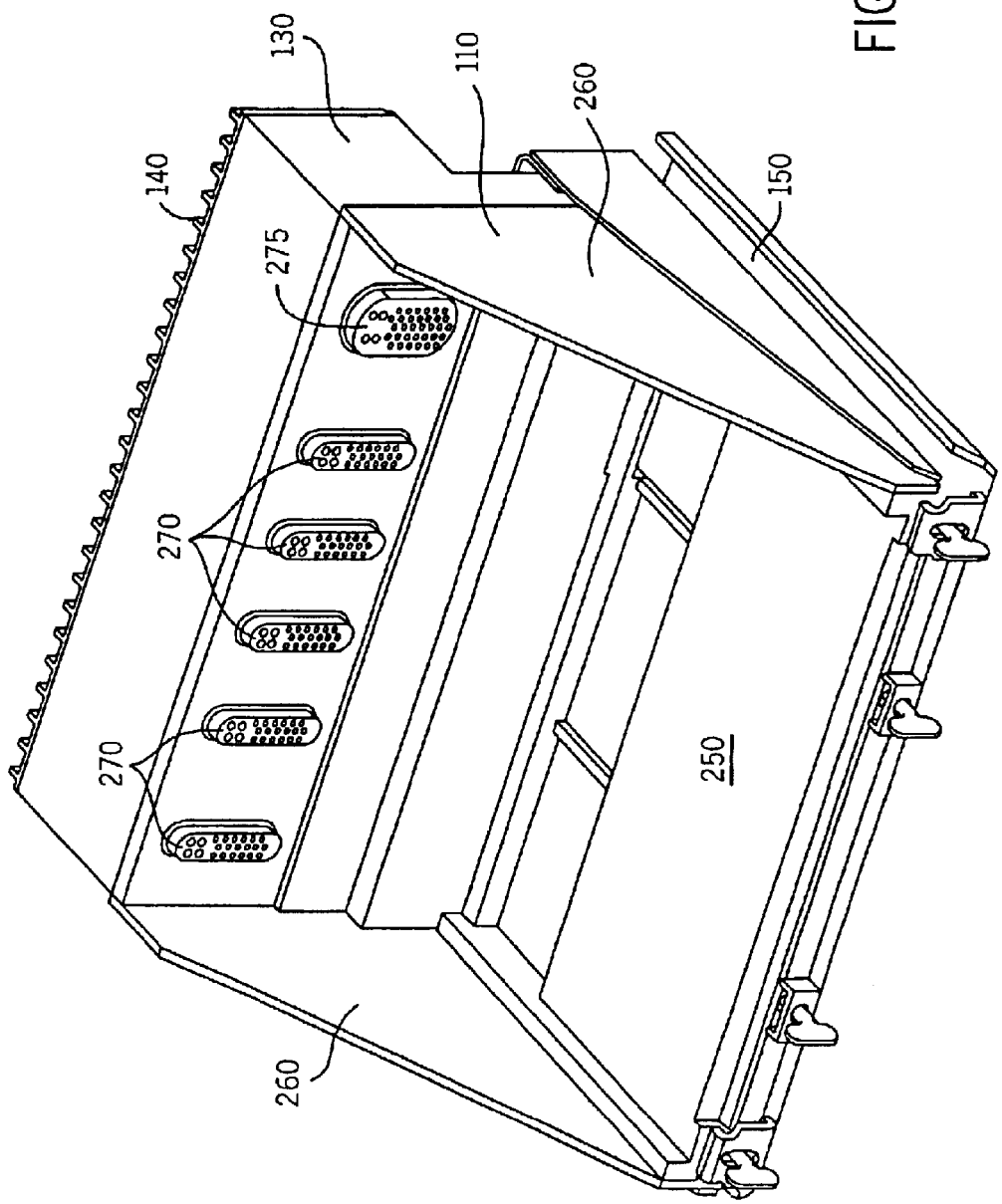
FIG. 2 is an exemplary depiction of the chassis and mount of FIG. 1.
Figure 3:
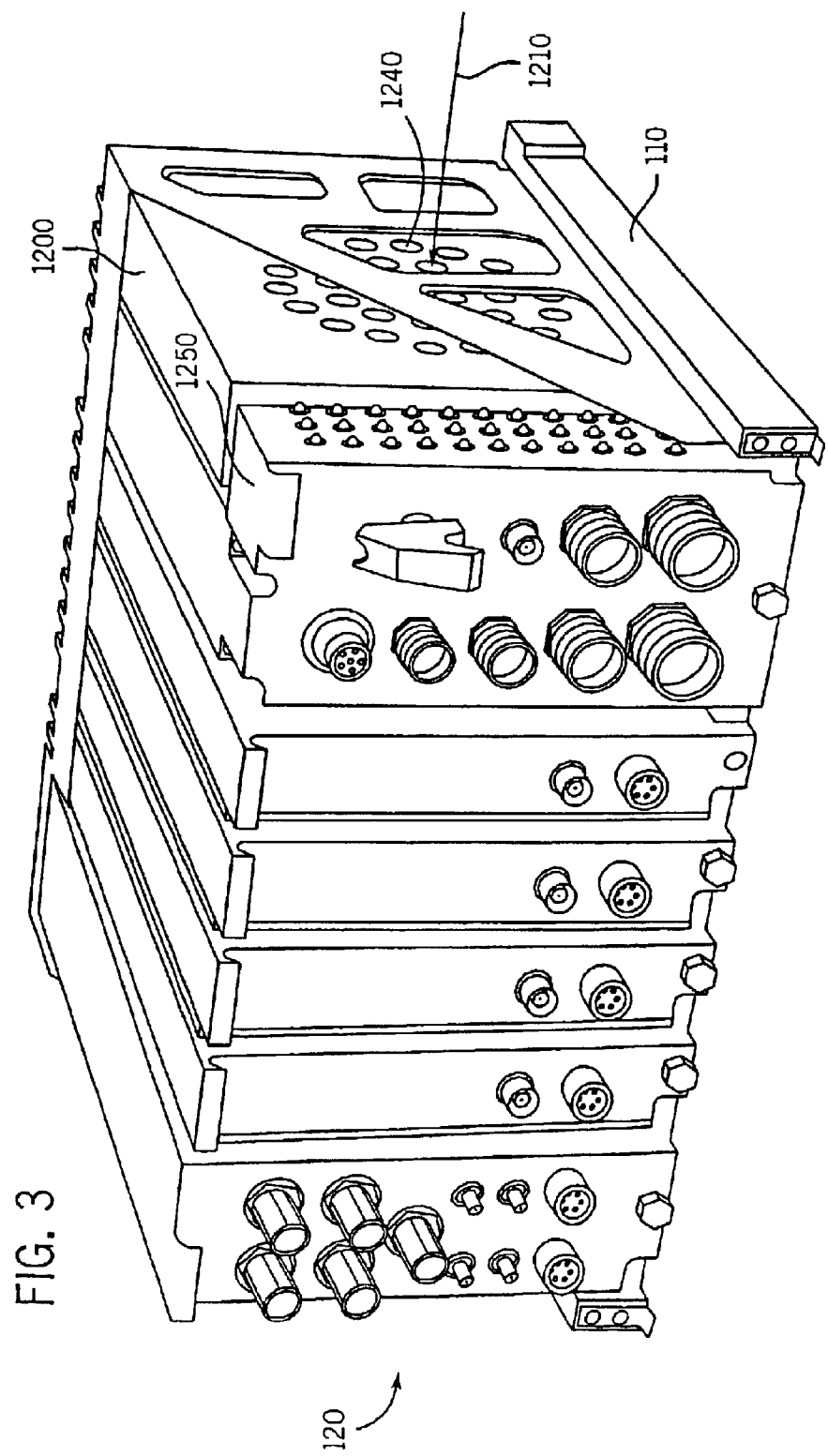
FIG. 3 is an exemplary depiction of a modular electronics system including an active air movement module.

Referring now to FIG. 2, chassis 110 is depicted. Chassis 110 includes a power supply 130 having a plurality of fins 140 for disposing of thermal energy from chassis 110 and generated by power source 130. Chassis 110 also includes a platform 250 for supporting electronic modules 120. Chassis 110 may also include side portions 260 which may partially encase the entire electronics package and also may provide rigidity and strength to chassis 110. Side portions 260 may be a solid panel as depicted, or further may be a panel including a plurality of apertures and/or openings as depicted in FIGS. 3 and 10–12. Chassis 110 may be an open frame chassis that is designed or configured for installation on existing end platform mounts, for example, an MT-6352 mount 150 depicted in FIGS. 1 and 2.

Further, chassis 110 includes a plurality of connectors and/or interfaces 270 and 275 that are used to interface a variety of electronic modules. In an exemplary embodiment, five of the connectors 270 are identical with one connector 275 being different to support a PIM. However, any of a variety of connector configurations may be used depending on the end use. Chassis 110 is preferably formed of a cast aluminum material, but may be formed of any of a variety of rigid materials, including, but not limited to, other metal and metal alloys, polymers, ceramics, composite materials, and the like. When electronic modules are installed, signaling between each of the electronic modules is distributed in the modular electronics platform adapter 110. In a particular embodiment, each of the electronic subsystem module positions in chassis 110 includes a signal interface and connector 270, which are interconnected for communicating with each other. The rugged electronic subsystem modules may share a common universal signaling interface and connector type. A unique modular position having a unique modular connector 275 may be used to act as a hub for signals from all of the common module positions.

Because of the modularity of system 100, rugged modular electronics platform adapter 110 allows for a large potential number of end user configurations which may be tailored to the specific end user requirements. Further, because of the modularity of system 100, there are lower life cycle costs, and less costs of maintaining such systems is enabled because fewer total package assembly types need to be stocked.

In a particular exemplary embodiment, multiple modular electronics platform adapters (chassis 110) may be used together in a single installation on a vehicle or other installation site, rather than producing a single new chassis and new modules when larger systems are required. Further, the modularity of system 100 provides for the ability for an existing electronic subsystem module to be replaced with a newer technology or upgraded technology version. Further still, an advantage to using the modular electronics platform adapter 110 with electronic modules 120 is that when a single module fails, the module may be simply interchanged without having to remove the entire system 100 from the vehicle and sent out for repair. Also, some of the functionality of system 100 may be maintained even while certain modules are being repaired.

Because of the open and modular design of system 100, either passive natural convection cooling or active forced air cooling techniques may be utilized with the same set of electronic modules 120. Also, having a modular electronics mounting system approach provides benefits over a single monolithic one box approach in the area of channel-to-channel isolation. Because multiple radios may be used in a single housing, there may be significant channel-to-channel interference concerns with conventional systems. Utilizing a modular approach solves the isolation problem by isolating each radio module from each other and utilizing only a digital interface to the other radio system components (excluding power amplifiers, etc.). Although the disclosed system 100 may be utilized in military applications on military vehicles, the concepts disclosed and designs disclosed may be applied to other areas that include commercial products.

Figure 10:
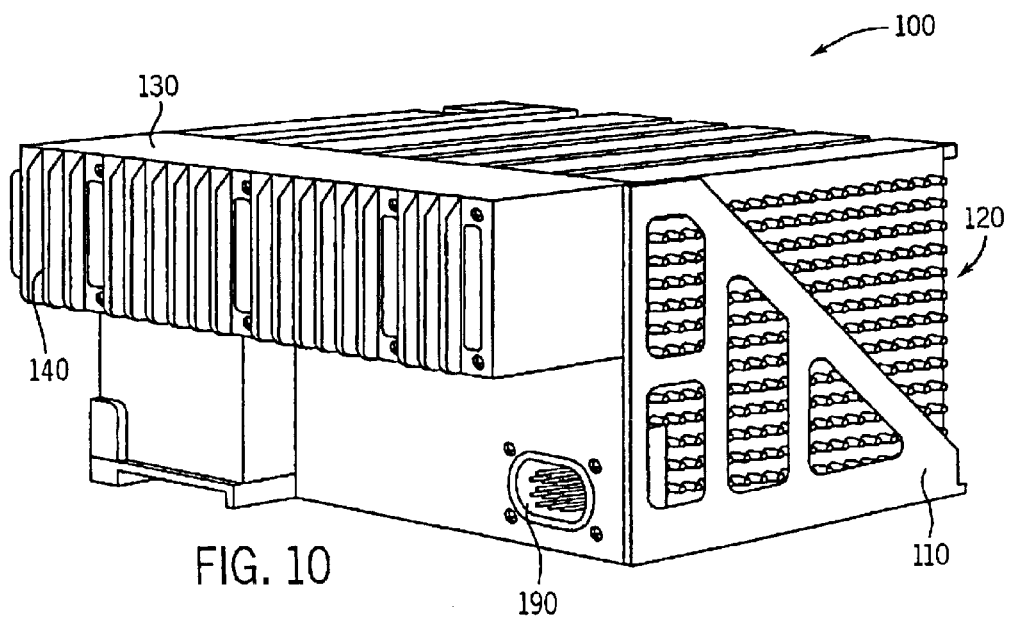
FIG. 10 is an exemplary rear perspective view of a modular electronic system package supported by a chassis.

Referring now to FIG. 10, a rear view of system 100 is depicted including chassis 110, power supply 130, with rear fins 140. Further, the rear electronic connector 190 is depicted. Connector 190 is configured to connect to a mating connector on the vehicle. Connector 190 is in communication with module 180 and power supply 130.

Figure 11:
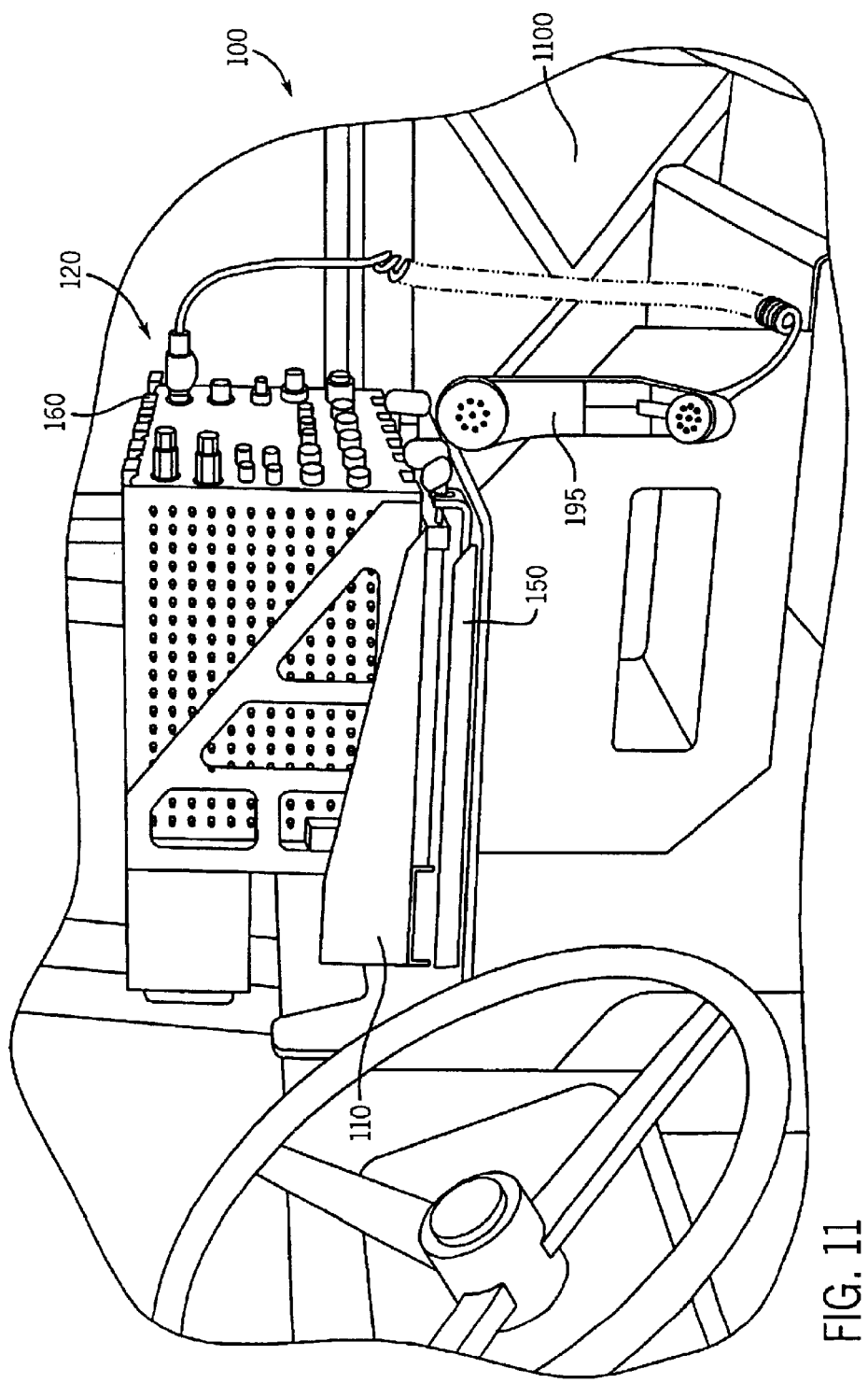
FIG. 11 is an exemplary perspective view of a modular electronic system installed in the cab of a vehicle.

Referring now to FIG. 11, system 100 is depicted in a vehicle 1100. System 100 is mounted on a mount 150 that is coupled to vehicle 1100. Chassis 110 is coupled to mount 150. Chassis 110 holds a plurality of ruggedized electronic modules 120. In the exemplary embodiment depicted, system 100 includes a hand set 195 for voice communications that is coupled to a PIM 160. In the exemplary embodiment depicted, vehicle 1100 is a Humvee. However, vehicle 1100 may be any of a variety of military or other vehicles including, but not limited to, tanks, jeeps, as well as airborne vehicles such as, but not limited to, helicopters, airplanes, and the like. In further alternative embodiments, system 100 may be mounted on the exterior of the vehicle, for example, the vehicle rear end, and therefore, be subjected to harsh environmental conditions such as, but not limited to, dirt, dust, water, chemicals, submersion in liquids, and the like.

Figure 12:
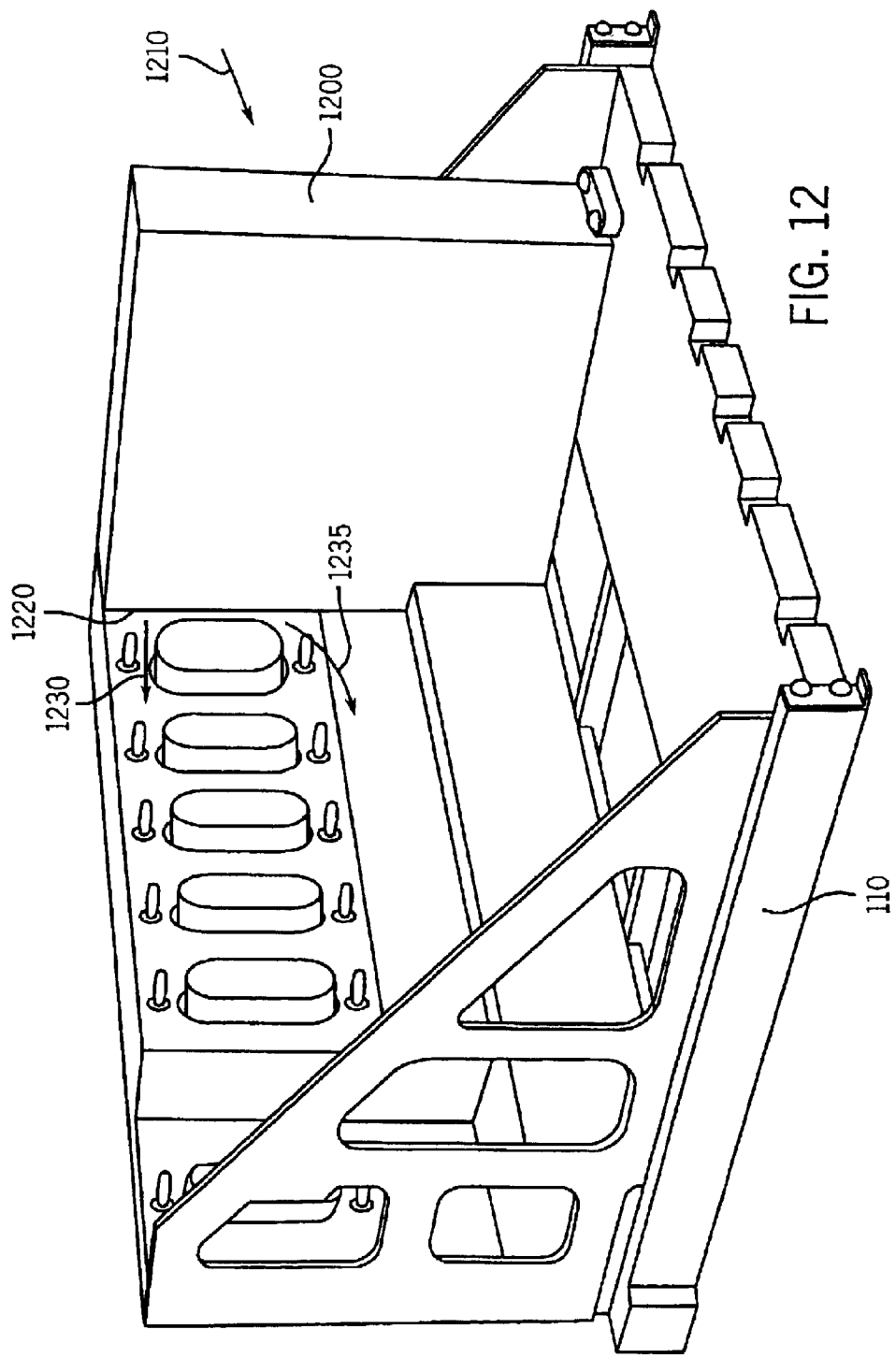
FIG. 12 is an exemplary embodiment of an electronic module chassis having an air mover module installed.

Referring now to FIG. 12, an exemplary embodiment of chassis 110 is depicted. Chassis 110 is depicted having an air mover module 1200 coupled thereto. In an exemplary embodiment, air mover module 1200 has a plurality of openings configured on the unseen side of module 1200 that are used to bring ambient air into module 1200 in direction 1210. The inclusion of an air mover module 1200 may be used particularly in airborne applications. Air entering in direction 1210 will exit via a slit on surface 1220 which is facing chassis 110 in direction 1230. Air from air mover module 1200 moves air in direction 1230 and chassis 110 directs the air in direction 1235, as well as in many other directions. Air from air mover module 1200 will exit chassis 110 through apertures 1245 in direction 1250 and will be dispersed and blown past modules which may be installed on chassis 110. For example, referring now to FIGS. 3 and 10–12, chassis 110 is depicted having a plurality of modules 120 installed thereon and including an air mover module 1200 and showing apertures 1240 for receiving air in direction 1210 depicted in FIG. 12. Air mover module 1200 is configured to be nested in a PIM 1250 which is formed to surround air mover module 1200 within chassis 110.

While the detailed drawings, specific examples and particular formulations given describe preferred and exemplary embodiments, they serve the purpose of illustration only. The inventions disclosed are not limited to the specific forms shown. The hardware configurations shown and described may differ depending on the chosen performance characteristics and physical characteristics of the electronic devices. For example, the type of electronic device, electronic system, or materials and structures used may differ. The systems and methods depicted and described are not limited to the precise details and conditions disclosed. Furthermore, other substitutions, modifications, changes, and omissions may be made in the design, operating conditions, and arrangement of the exemplary embodiments without departing from the scope of the invention as expressed in the appended claims.

What is claimed is:

1. A chassis for a ruggedized modular electronics system, comprising:
   an open support structure configured to support ruggedized electronics modules, the open support structure allowing ambient airflow around the exterior of the ruggedized electronics modules;
   a first electrical connector supported by the support structure;
   a second electrical connector supported by the support structure, the second electrical connector electrically coupled to the first electrical connector; and
   a power supply supported by the support structure, wherein the power supply is integrated into a chamber of the support structure, the chamber being environmentally sealed.

2. The chassis of claim 1, wherein the open support structure includes aluminum.

3. The chassis of claim 1, wherein the chamber includes a plurality of heat dissipation structures extending from the exterior surface of the support structure.

4. The chassis of claim 1, further comprising:
   a plurality of electrical connectors, at least one of the electrical connectors being of a different type than the other of the electrical connectors.

5. The chassis of claim 1, wherein the electronics modules are each a component of a radio system.

6. A chassis for a ruggedized modular electronics system, comprising:
   a means for supporting a first ruggedized electronics module and a second ruggedized electronics module, the means for supporting allowing ambient airflow around the exterior of the first and second ruggedized electronics modules;
   a first means for connecting the first ruggedized electronics module to the second ruggedized electronics module, the first means being supported by the means for supporting;
   a second means for connecting the second ruggedized electronics module to the first ruggedized electronics module, the second means for connecting being supported by the means for supporting; and
   a power supply supported by the means for supporting, wherein the power supply is integrated into a chamber of the means for supporting, the chamber being environmentally sealed.

7. The chassis of claim 6, wherein the means for supporting includes aluminum.

8. The chassis of claim 6, wherein the chamber includes a plurality of heat dissipation structures extending from the exterior surface of the means for supporting.

9. The chassis of claim 6, further comprising:
   a plurality of means for connecting, at least one of the means for connecting being of a different type than the other of the means for connecting.

10. The chassis of claim 6, wherein the ruggedized electronics modules are each a component of a radio system.

11. A support structure for a ruggedized modular electronics system, comprising:
    a base portion;
    two opposing side portions extending from the base portion;
    a rear portion extending from the base portion, the rear portion supporting more than one electrical connectors; and
    a power supply supported by the rear portion and configured to provide power to ruggedized electronics modules coupled to the electrical connectors, wherein the power supply is integrated into an environmentally sealed chamber of the support structure.

12. The support structure of claim 11, wherein the electrical connectors are at least partially electrically coupled to each other.

13. The support structure of claim 11, wherein the support structure is configured to accommodate an active cooling module.

14. The support structure of claim 11, wherein the two opposing side portions include apertures therethrough.

* * * * *